(12) United States Patent
Gilliland

(10) Patent No.: US 6,206,582 B1
(45) Date of Patent: Mar. 27, 2001

(54) EMI REDUCTION FOR OPTICAL SUBASSEMBLY

(75) Inventor: Patrick B. Gilliland, Chicago, IL (US)

(73) Assignee: Stratos Lightwave, Inc., Chicago, IL (US)

( * ) Notice: Subject to any disclaimer, the term of this patent is extended or adjusted under 35 U.S.C. 154(b) by 0 days.

(21) Appl. No.: 09/235,577

(22) Filed: Jan. 22, 1999

(51) Int. Cl.$^7$ .................................................. G02B 6/36
(52) U.S. Cl. .............................. 385/92; 385/88; 385/92; 385/35; 385/139
(58) Field of Search .............................. 385/88, 89, 92, 385/93, 139, 35

(56) References Cited

U.S. PATENT DOCUMENTS

| 4,911,519 | * | 3/1990 | Burton et al. | 385/92 X |
| 4,979,787 | * | 12/1990 | Lictenberger | 385/92 X |
| 5,011,246 | * | 4/1991 | Corradetti et al. | 385/92 X |
| 5,337,396 | * | 8/1994 | Chen et al. | 385/92 |
| 6,000,856 | * | 12/1999 | Yunker | 385/75 |

* cited by examiner

Primary Examiner—Brian Healy
(74) Attorney, Agent, or Firm—Steven M. Evans; David L. Newman

(57) ABSTRACT

An optoelectronic transmitter module is provided for transmitting optical data signals from a host device. The module is housed within a grounded chassis of the host device and provides a reduced effective aperture therethrough. The module components include electronic circuitry mounted within the module configured to convert electrical data signals to an optical output signal. A conductive housing encloses the electronic circuitry. The module housing includes a first connector end adapted to receive a fiber optic connector. When the module is installed within the host device chassis, the connector end engages the host chassis to form a conductive barrier around the first end of the housing. A conductive transmitting optical subassembly (TOSA) is disposed within the connector end of the housing, forming a continuous conductive barrier therewith. The TOSA includes first and second ends with a narrow passage extending therebetween. The TOSA first end holds an optical package, and the second is configured to receive a fiber optic connector ferrule.

34 Claims, 6 Drawing Sheets

EMI REDUCTION FOR OPTICAL SUBASSEMBLY

BACKGROUND OF THE INVENTION

The present invention relates to optoelectronic modules and in particular to an optical subassembly providing for EMI reduction.

High speed optoelectronic transmitters are employed in data communications systems wherein large amounts of data are to be transferred at high speeds. In such systems, optoelectronic transmitters convert binary data signals from electrical impulses carried by electrical conductors such as copper wire and circuit traces to optical signals that may be transmitted over optical media such as fiber optic cables.

Some optoelectronic modules, such as 1×9 transceiver modules, are configured to be mounted directly to a printed circuit board within the host device. In this arrangement contact pins extend from the module and are soldered directly to contact points on the printed circuit board. The module is usually mounted near the edge of the printed circuit board such that the optical end of the module will protrude through a slot in an adjacent metal faceplate that may be mounted to the metal chassis of the host device.

The transciever module must include provisions for connecting the module to an optical transfer medium such as a fiber optic cable. A typical arrangement common to 1×9 modules is to provide a transceiver module having an SC-duplex fiber optic connector receptacle integrally formed at the optical end of the module. The SC-duplex receptacle is configured to receive an SC-duplex connector to couple a pair of optical fibers to the optoelectronic module. A first optical fiber carries optical signals transmitted by the module, while a second carries optical signals to be received by the module.

Optoelectronic transceivers are often high speed devices capable of transmitting serial data streams at speeds above 1 gigabaud. At these high data rates, electronic components and circuitry within the module tend to radiate high frequency noise that can interfere with surrounding equipment. Therefore, care must be taken to prevent spurious emissions from escaping from the module housing and disrupting the operation of nearby devices.

A host device such as computer or a mass storage device will typically include a conductive chassis or case surrounding the internal electronic componentry. In most cases, the chassis will be connected to earth ground thereby establishing a reference potential on the conductive chassis known as case ground. The electronic circuitry for interfacing with the optoelectronic module will be completely enclosed within the grounded metallic chassis. However, an opening in the form of a rectangular cutout must be provided for allowing a fiber optic connector to be connected to a board mounted transceiver located within the chassis. Undesirably, the opening provided to receive the fiber optic connector provides an aperture through which high frequency electromagnetic interference (EMI) can escape the grounded chassis to interfere with the operation of surrounding equipment. Therefore, in order to reduce spurious emissions, it is important to limit the size of the emission aperture of the optoelectronic connector receiving slot formed in the host chassis.

FIG. 1 shows a portion of the optical end of a prior art optoelectronic transceiver module 10 inserted within the chassis 12 of a host device. The module 10 includes a metal or metallized connector clip comprising a first prong 14 and a second prong 52 for receiving and retaining a fiber optic connector. Aligned concentrically within the connector clip is a Transmitting Optical Sub-Assembly (TOSA). The TOSA includes a plastic housing 16, a focusing element 24, an annular mounting surface 32, an alignment ring 34, and an optical package 26. The external end of the TOSA housing 16 defines a ferrule receiving bore 18 configured to receive a fiber optic connector ferrule 20 which aligns the optical fiber 22 carried within the ferrule with the optoelectronic device contained within the optical package 26.

The optical package itself contains several discrete components, including a metal cover 28, a transparent window 29, and a conductive base or header 30. The header 30 and cover 28 are both formed of metal and are electrically connected such that the entire outer surface of the optical package, excluding the transparent window, is maintained at the same electrical potential. An insulating substrate 36 is provided within the optical package on the upper surface of the header. Electronic components including a Vertical Cavity Surface Emitting Laser (VCSEL) or high speed light emitting diode (LED) and associated contacts and power monitoring circuitry are mounted on the insulating substrate 36.

A plurality of signal pins extend through the header 30 and are connected to various components mounted on the insulating substrate 36. The signal pins shown in FIG. 1 include a laser bias signal pin 40, a monitor current signal pin 42, and a signal ground pin 44. The laser bias signal pin 40 and the monitor current signal pin 42 are insulated from the metal header 30 by glass sleeves 46 disposed between the pins and the header. The ground pin 44, however, is welded directly to header 30 such that the entire optical package is maintained at signal ground potential.

It should be noted that in the operation of optoelectronic modules it is necessary to separate signal ground from case ground. Therefore, in the module of FIG. 1 it is necessary to electrically isolate the outer metal covering of the optical package from the connecting clips 14, 15 which are maintained at case ground. In the device depicted in FIG. 1, several conductive components are in contact with the optical package 26, these include the alignment ring 34, the annular mounting surface 32 threaded onto the end of TOSA housing 16, and the metallized plastic transceiver housing 10. Together, these components form a continuous path to the signal ground pin 44 soldered to header 30, and therefore must be isolated from the case ground. TOSA 16 is mounted directly to the prongs 14, 52 of the metallized plastic connector clip which is integral to the metallized plastic transceiver housing 10. The transceiver housing 10 is connected to case ground via grounding tab 50. Because the TOSA housing 16 is connected to components held at both case ground and signal ground potential, the TOSA housing 16 itself must be formed of a non-conductive material in order to maintain isolation between the two distinct electrical ground potentials.

In the arrangement shown in FIG. 1, when the transceiver module is properly installed within the chassis of a host device, the emissions aperture of the SC connector receiving port of the transceiver module in the host chassis is defined by the outside diameter of the TOSA housing 16 and the distance between the grounded prongs 14, 52 of the connector clip. If an SC-Duplex connector is employed, prongs 14,52 are located 0.275" apart, and the outside diameter of the TOSA housing 16 and identified as AE, is approximately 0.250 inches.

The emissions aperture through a conductive surface is a function of both the dimensions of the cutout and the thickness of the panel. A relatively small hole in a large conductive surface will block low frequency signals as effectively as a solid sheet. At very high frequencies, however, the same small hole may allow a signal to pass the conductive barrier relatively unattenuated. Thus, as optoelectronic modules are operated at ever higher frequencies, it becomes necessary to take steps to reduce the emissions aperture of the modules in order to reduce the amount of EMI that can escape the module and interfere with surrounding equipment. Therefore, what is needed is an optoelectronic module which reduces the emissions aperture through which spurious electromagnetic emissions can escape the grounded host chassis.

SUMMARY OF THE INVENTION

In light of the background given above, the primary object of the present invention is to provide a high speed optoelectronic module for use in conjunction with a host device wherein the emissions aperture of the module is minimized. This object, as well as others that will become apparent upon reading the detailed description of the preferred embodiment, is achieved by an optoelectronic module which may be directly mounted to a circuit board mounted within the host device or otherwise connected. In the preferred embodiment of the invention an optoelectronic module includes a metallized housing covering the high frequency electronic components necessary to transmit and receive optical signals and interface with the host device. A first end of the module is configured to interface with the host device, and a second end is formed having an integrally formed fiber optic connector receptacle. The metallized housing is configured such that when the module is installed in the host device, the integrally formed fiber optic connector receptacle will protrude slightly from the chassis, allowing a mating fiber optic connector to be easily inserted therein. Further, the metallized housing is configured to contact the perimeter of the fiber optic connector receiving cutout in the host chassis. A grounding tab extends from the optoelectronic module metallized housing to engage the chassis, thereby connecting the metallized housing to the case ground potential of the host device chassis.

A Transmitting Optical Sub-Assembly (TOSA) is provided within the integral fiber optic connector receptacle. The TOSA includes a metallized TOSA housing configured to receive an optical package, and provides a ferrule receiving bore for receiving the alignment ferrule of a fiber optic connector. Both the metallized module housing and the metallized TOSA housing include overlapping complementary mating surfaces such that together the module housing and TOSA housing form a continuous conductive barrier across the second end of the module with the exception of a small circular aperture associated with the optical focussing element.

The optical package mounted within the TOSA housing includes a metal header for supporting an optical transmitting device such as a Vertical Cavity Surface Emitting Laser (VCSEL) or other high speed light emitting device. A metal cover that includes a transparent window is fitted over the header, sealing the optical package. Thus, the majority of the outer surfaces of the optical package comprise a conductive metallic surface. The optical package is mounted within the TOSA housing via a metal alignment ring mounted to the optical package and a metal mounting ring that is threaded onto the TOSA housing. The alignment ring and the mounting ring are welded together such that a continuous electrical path extends from the metallized TOSA housing to outer surfaces of the optical package. When the module is installed within a host device, the metallized module housing is electrically connected to the host chassis such that the continuous electrical path extends all the way from the host device chassis to the outer surfaces of the optical package. Thus, the optical package, as well as all the components in between, is maintained at the host device case ground potential.

A plurality of signal pins extend through the optical package header carrying electrical signals to the optical transmitting device mounted on the header. The signal pins, including a signal ground pin, are isolated from the metal header via glass sleeves surrounding the pins. Thus, the signal ground is maintained as a reference potential distinct from case ground.

A small passage extends through the TOSA housing allowing optical signals emanating from the optical package to be coupled to an optical fiber carried by a fiber optic connector ferrule inserted within the TOSA housing's ferrule receiving bore. This narrow passage represents the only opening in the conductive barrier extending across the second end of the optoelectronic module. All of the remaining surfaces at the end of the module are conductive and connected to case ground. Thus, the emissions aperture of the module is reduced to the diameter of the cylindrical passage between the optical package and the ferrule receiving bore, thereby significantly inhibiting spurious electromagnetic emissions from the module.

As shown in FIG. 2 module 100 is mounted directly to a printed circuit board

DETAILED DESCRIPTION OF THE PREFERRED EMBODIMENT

Figure 2:
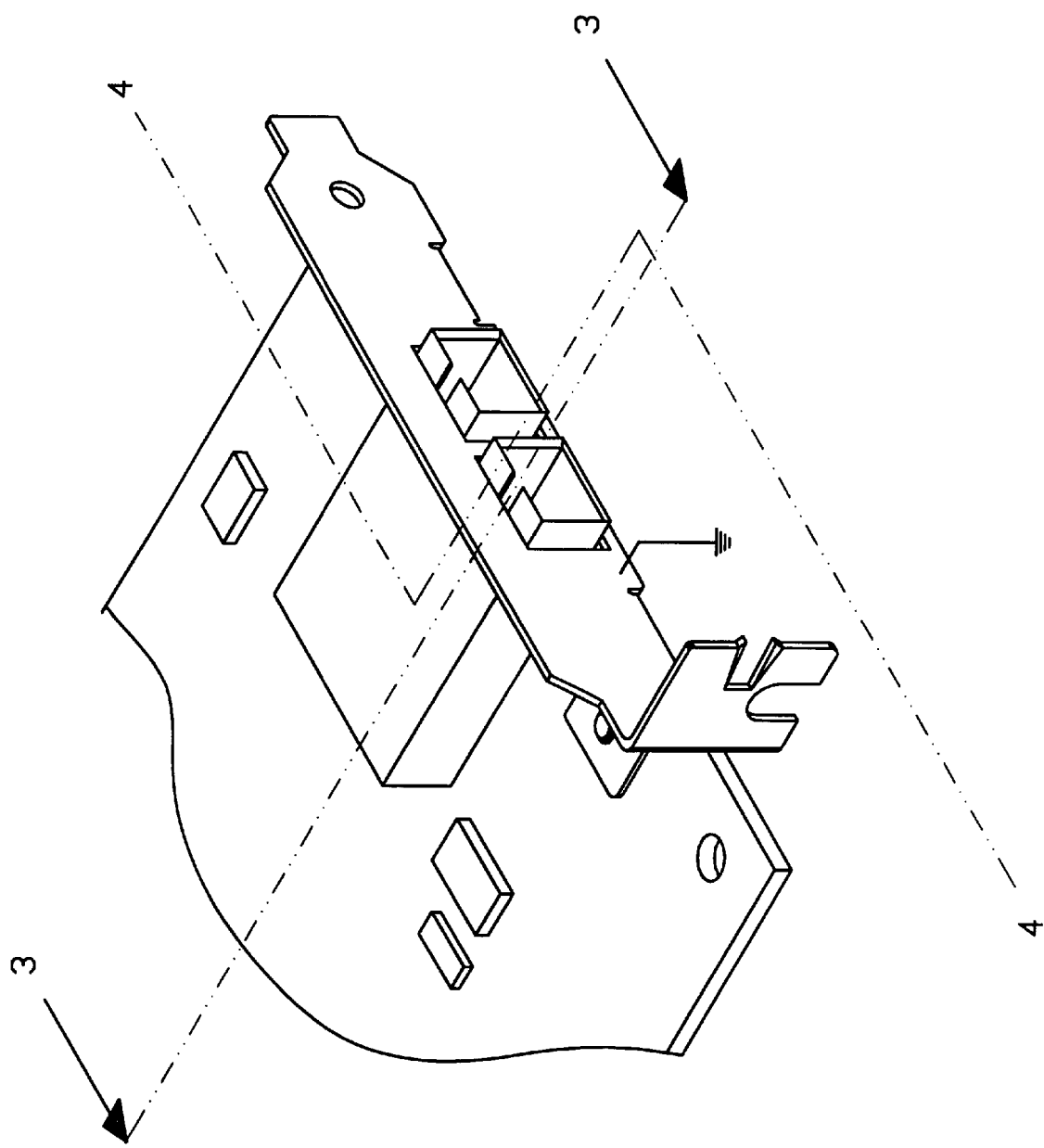
FIG. 2 is a perspective view of an optoelectronic module according to the preferred embodiment of the invention wherein the module is mounted to a printed circuit board and metal faceplate.
Figure 3:
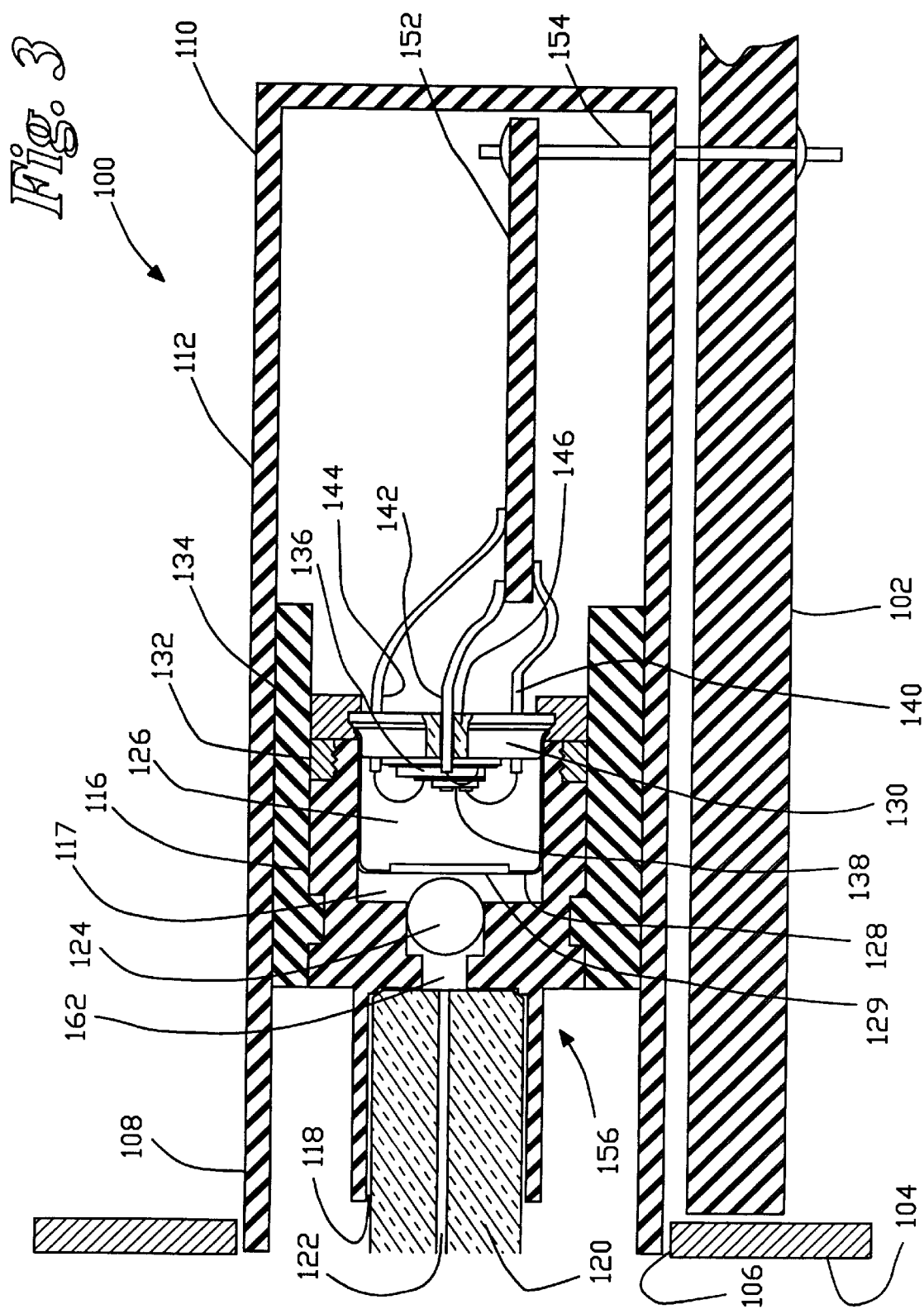
FIG. 3 is a cross section of the optoelectronic module of FIG. 2 taken along the line 3—3.
Figure 4:
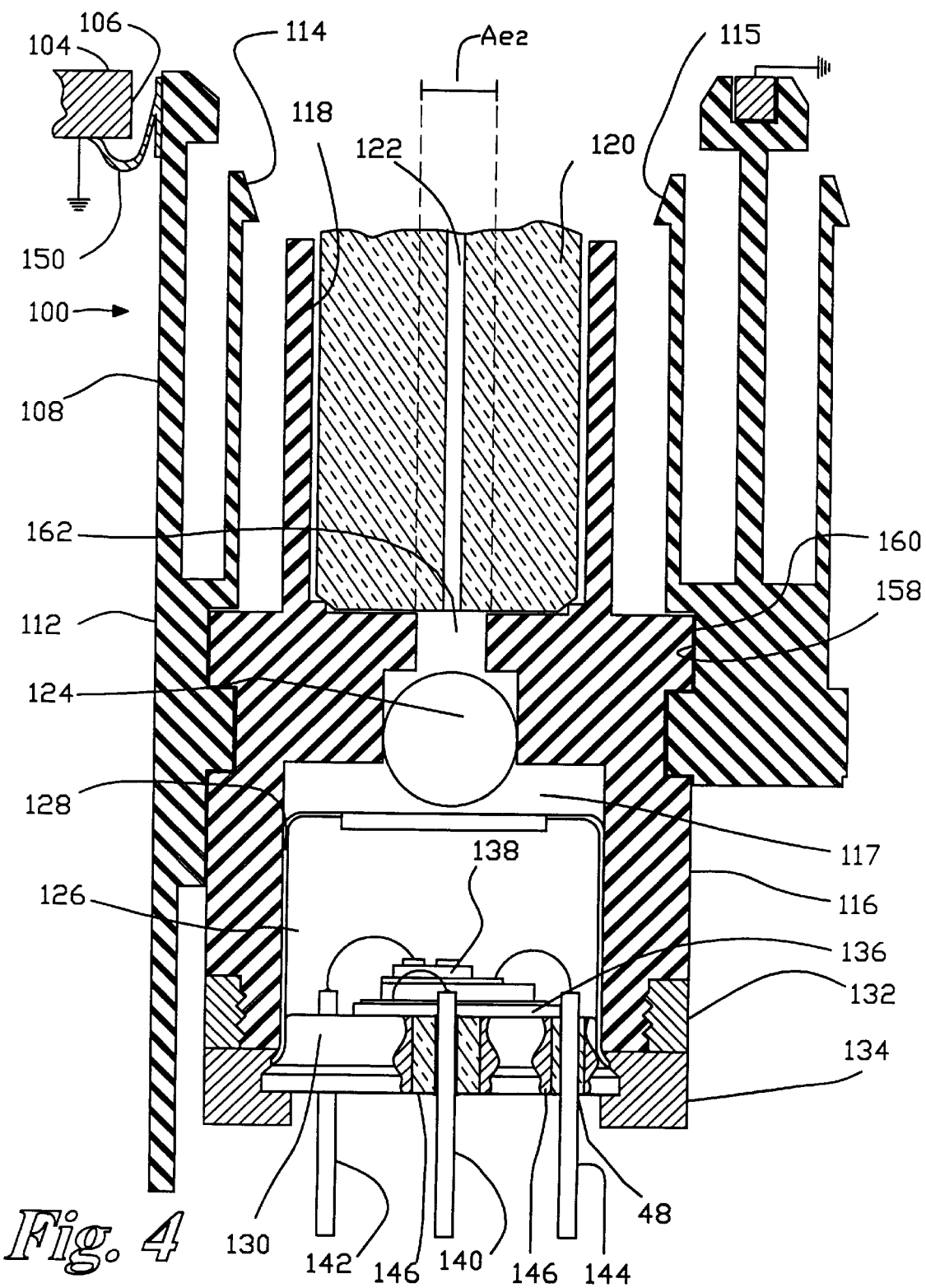
FIG. 4 is a cross section of the optoelectronic module of FIG. 2 taken along the line 4—4.

Referring to FIGS. 2, 3 and 4, an optoelectronic transceiver module according the preferred embodiment of the invention is shown at 100. Module 100 is shown as a 1×9 transceiver. A defining characteristic of 1×9 transceivers is a single row of nine contact pins 154 located near the rear end of the module. The contact pins provide the interface between the module 100 and the host device. While the 1×9 configuration is preferred, other interface configurations, such as intermatable electrical connectors may be employed such as defined in the GBIC Specification without departing from the inventive aspects of the present invention.

As shown in FIG. 2, module 100 is mounted directly to a printed circuit board 102 that is a component of the host device. A metal faceplate 104 is attached to the printed circuit board 102 and is adapted to mount directly to the host device chassis (not shown) when the printed circuit board is installed in the host device. Two rectangular cutouts 106 are formed in faceplate 104 and a small portion of the optical end 108 of module 100 extends through each cutout. When the faceplate is mounted to the host chassis, a continuous metal barrier, interrupted only by the rectangular cutouts 106, is formed. At the interface end of the module 110, contact pins 154 (FIG. 3) extend through the bottom of the module and are soldered to contact points formed on host printed circuit board 102.

Module 100 includes a metallized housing 112 enclosing the operational electronics of the optoelectronic transceiver module. A printed circuit board 152 and a TOSA 156 are among the components mounted within the metallized housing 112. A fiber optic connector retaining clip is integrally formed with the module housing 112. The connector clip comprises a pair of hooked prongs 114, 115 located on each side of the TOSA 156. The connector clip acts to retain a fiber optic connector when the connector is inserted into the module.

The TOSA 156 includes a metallized housing 116, a focusing element 124, a metal mounting ring 132 threaded onto the end of the housing 116, an alignment ring 134 welded to the mounting ring, and an optical package 126 mounted to the alignment ring. A first end of the TOSA housing 116 defines an optics cavity 117 configured to receive the optical package 126. The opposite end of the TOSA housing defines a bore 118 configured to receive fiber optic connector ferrule 120. The bore 118 further acts to align an optical fiber 122 contained within the ferrule with the output signal of optical package 126. A cylindrical passage 162 extends between the optics cavity 117 and the ferrule receiving bore 118. The passage allows optical signals to pass from the optical package 126 to the optical fiber 122 carried within the connector ferrule 120.

Optical package 126 is formed of a metal cover 128 which includes a transparent window 129 and a metal header 130. The cover 128 fits over the header 130, and the two may be welded or otherwise joined to provide a single sealed package. An insulating substrate 136 is mounted on the upper surface of the header, serving as a base for mounting a light emitting device such as a VCSEL, as well as other electronic components for providing power monitoring and other features. Because the header 130 and cover 128 are metal, the entire outer surface of the optical package, excluding the transparent window 129, forms a continuous conductive surface. Thus, the entire outer surface of the optical package will be maintained at the same electrical potential.

A plurality of signal pins penetrate the header 130 and carry signals to the electronic components mounted within the optical package 126. These pins include a laser bias signal pin 140, a monitor current signal pin 142, and a signal ground pin 144. Unlike prior art designs, all of the signal pins, including signal ground pin 144, are isolated from the header 130 by glass sleeves 146. Therefore, the signal ground potential can be maintained separate from the electrical potential present on the outer surface of the optical package 126. As can be seen in FIG. 3, signal pins 140, 142, 144 are connected to circuits formed on the printed circuit board 152 mounted within module 100, and contact pins 154 carry the signals between the module and the host device.

Both housings 112, 116 and the outer surfaces of the optical package 126 are metallic. Thus, these structures may be directly formed of a conductive metal, or formed of a non-metal material that has been imbued with certain metallic characteristics. For ease of manufacture, it is desirable to form these structures of metallized plastic. Metallized plastic components have the desirable conductive qualities of metal components, but are much less expensive to make. The metallization process involves applying a thin metallic coating to the outer surfaces of the housings. The preferred coating is 3000 angstroms of stainless steel over 1000 angstroms of copper deposited in a vacuum chamber via physical vapor deposition. The conductive coating may be applied by plating the plastic housings in a metallic solution, or spraying a metallic coating onto the outer surfaces of the components, or otherwise applying a conductive layer to the outer surfaces of the housings.

Figure 1:
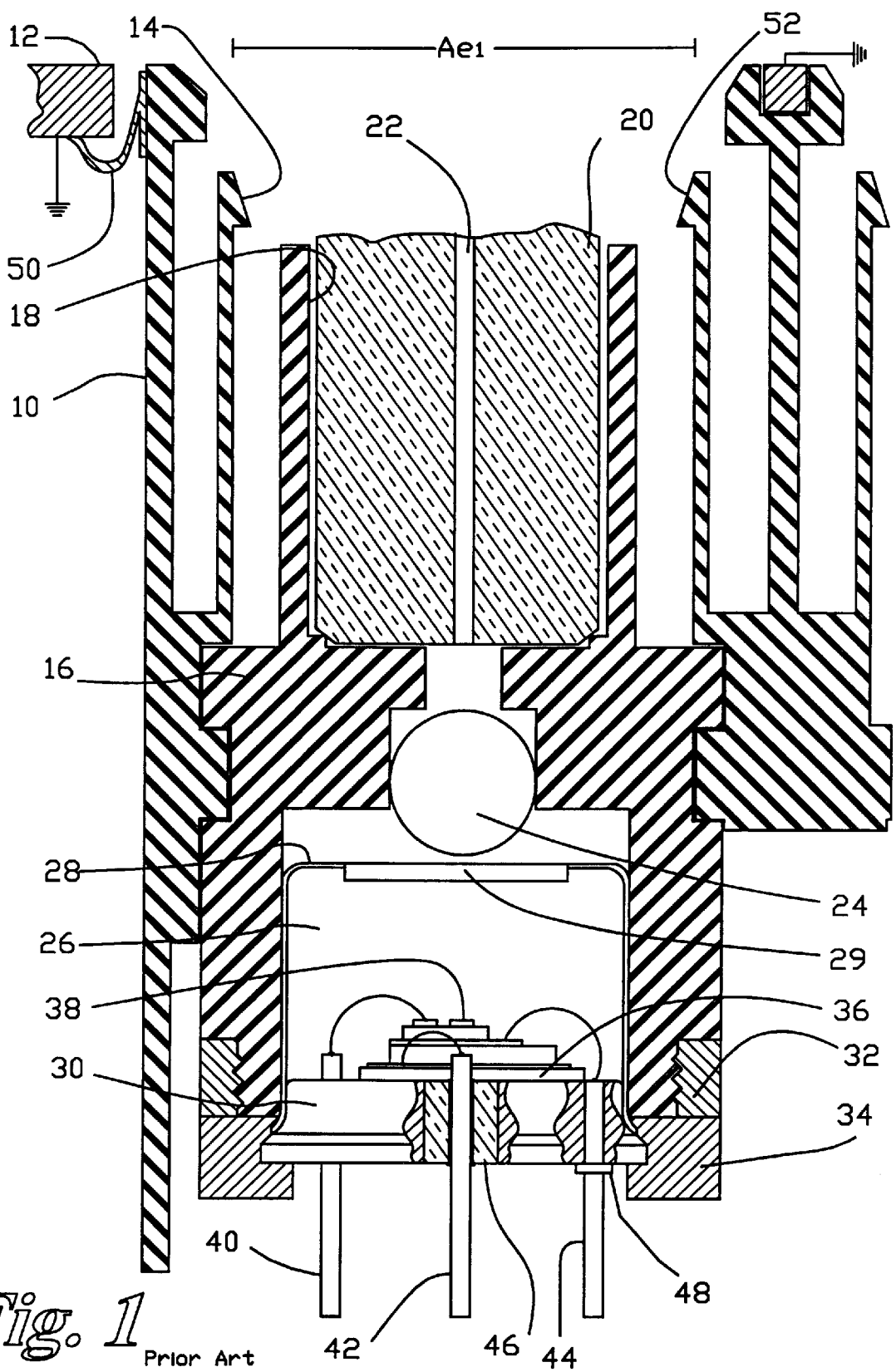
FIG. 1 is a partial cross section of the optical connector end of a prior art optoelectronic transceiver.

In the section view of FIG. 4 it can be seen that the metallized TOSA housing 116 and the metallized module housing 112 are formed with overlapping complementary mating surfaces 158, 160. As both housings are coated with a conductive material, the TOSA housing and module housing form a continuous conductive barrier across the optical end 108 of the module. This barrier is interrupted only by the narrow passage 162 that extends through the TOSA housing between the optics cavity 117 and the ferrule receiving bore 118. Passage 162 defines $AE_2$ and in an embodiment has a diameter of 0.010 inches. Thus it may be understood that the present invention provides a vast improvement in the reduction in the size of the emissions aperture from 0.250 inches ($AE_1$ in the prior art embodiment of FIG. 1) to 0.010 inches in the embodiment of FIG. 4.

When module 100 is installed within a host device, a grounding tab 150 electrically connects the metallized module housing 112 to the case ground of the host device. The metallized TOSA housing 116, mounting ring 132, alignment ring 134, and optical package 126 are all formed of conductive material and thus are all maintained at the host device case ground potential. Because nearly the entire front end of the module comprises a grounded conductive barrier, the emissions aperture ($AE_2$) of the module is reduced to the diameter of the cylindrical passage 162 extending through the TOSA housing 116 between the optics cavity 117 and the ferrule receiving bore 118. Due to the electrical isolation of the signal ground pin 144 from header 130, a case grounded barrier is formed across nearly the entire optical end of the module 100 while providing a distinct isolated signal ground to the optical device.

Figure 5:
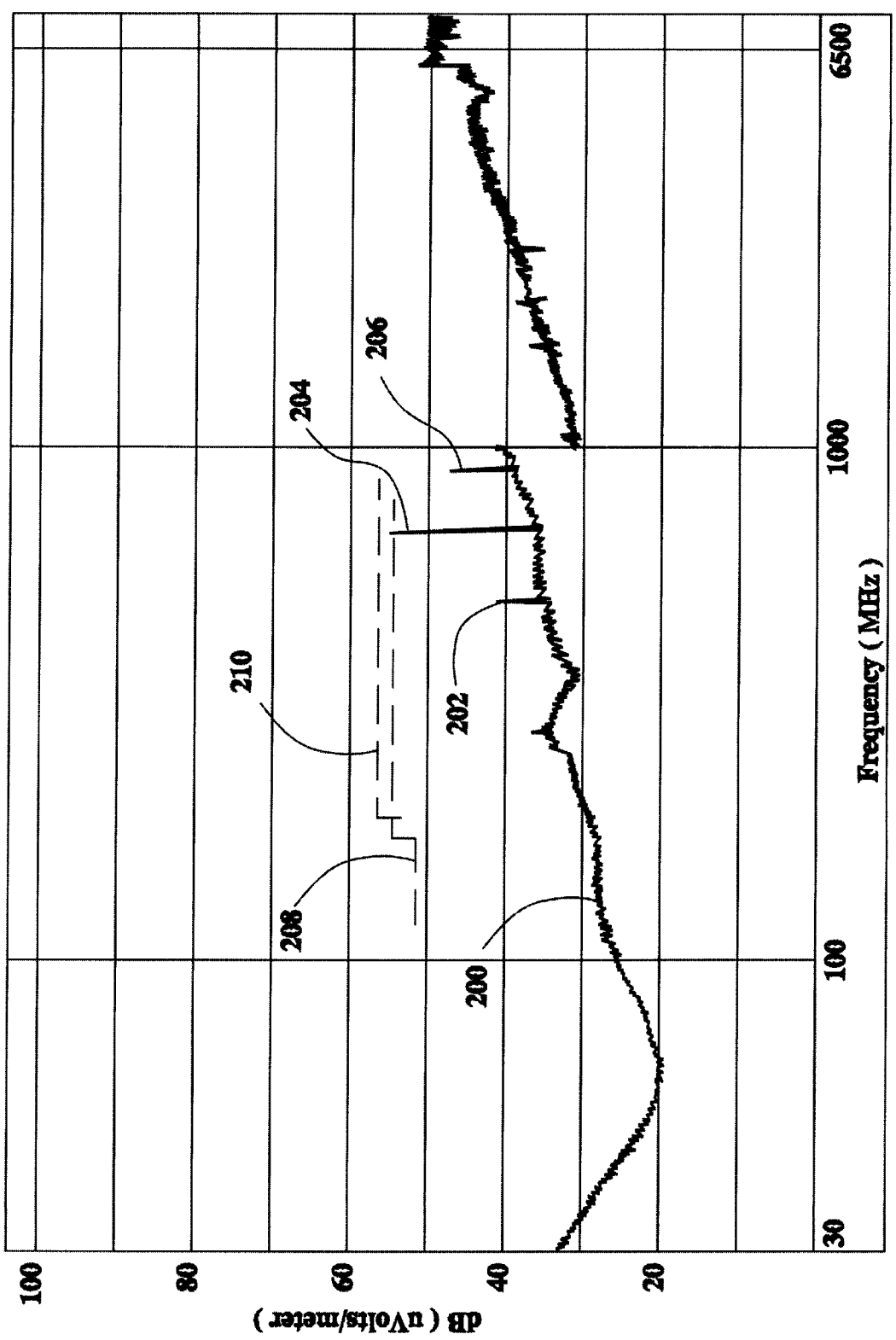
FIG. 5 is a test chart for electromagnetic radiation for a prior art module.
Figure 6:
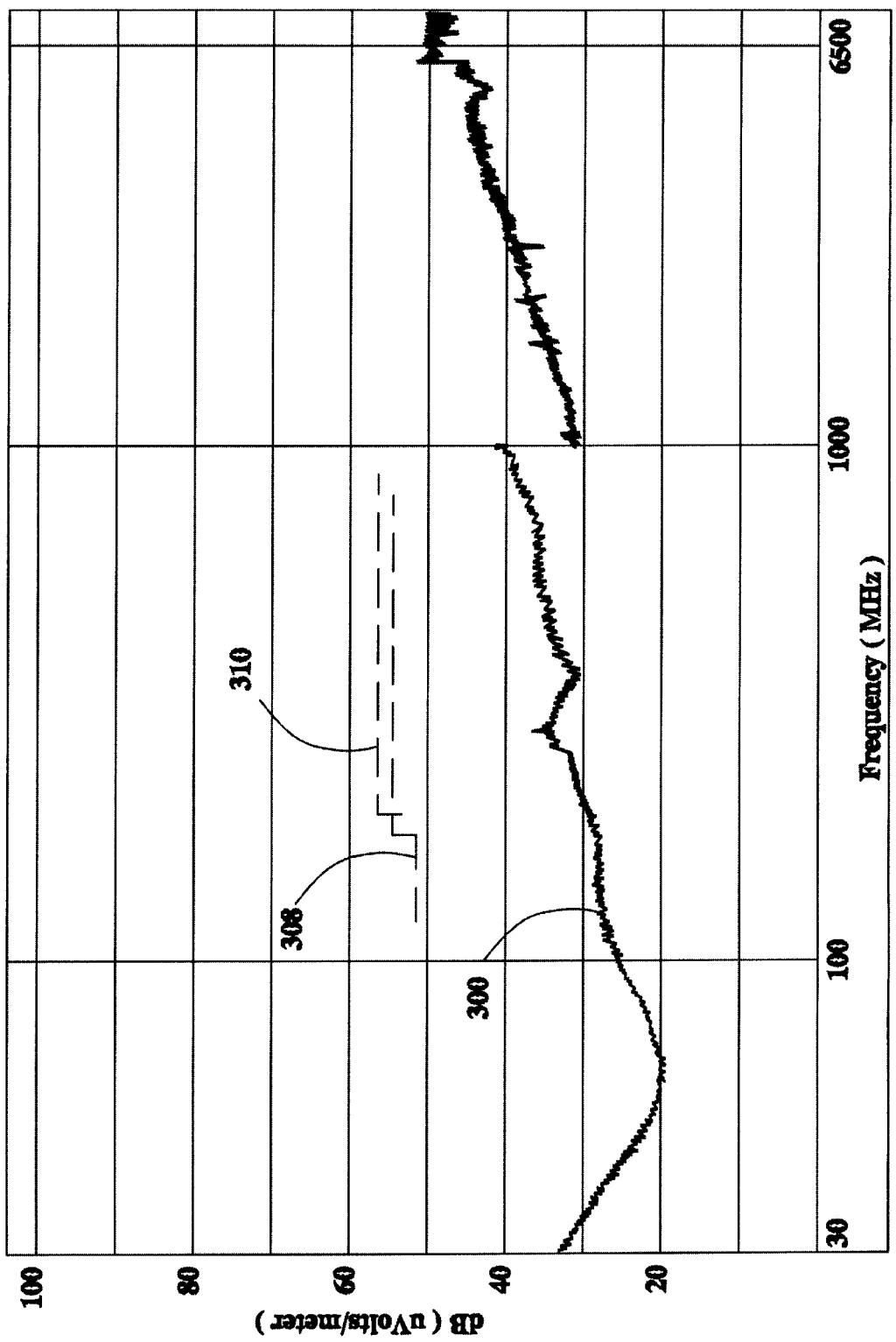
FIG. 6 is a test chart for electromagnetic radiation for the present invention.

The reduced effective aperture of module 100 significantly reduces the amount of EMI that escapes the host chassis. The reduction in EMI escaping from a module constructed according to the present invention as compared to that escaping from a module constructed according to the design shown in FIG. 1 can be seen by comparing the test results shown in FIGS. 5 and 6. FIG. 5 charts the test results for a device having a construction of the prior art similar to FIG. 1. FIG. 6 charts the test results for a device having a construction of the present invention similar to FIGS. 2–4.

Both FIGS. 5 and 6 show the amount of electromagnetic radiation escaping from an optoelectronic module measured at a distance of 1 meter from the module. The horizontal axis of each plot shows the frequency, and the vertical axis shows the magnitude of the electric field measured in the horizontal radiating plane expressed in db (micro-volts/meter). Maximum noise thresholds established by European and American regulatory agencies are shown as 208, 210 and 308, 310 in FIGS. 5 and 6 respectively. These thresholds represent the maximum allowed EMI measured at a distance of one meter from the device. Both plots show dark curves, 200, 300 respectively, that trend generally upward with increasing frequency. Both curves 200, 300 appear very similar. In the main, these curves merely represent the baseline noise introduced into the test procedure by the receiving amplifier.

However, curve 200 includes several sharp spikes 202, 204, 206 at frequencies of 550 MHz, 702.5 MHz, and 858.6 MHz. The location of these spikes along the horizontal axis represents the fundamental frequencies of the test signal supplied to the optoelectronic module. The magnitude of the spikes represents the strength of the signal escaping from the module. The results of the test shown in FIG. 5 in numerical form are as follows:

| Mkr. No. | Test Frequency [MHZ] | Meter Reading dB (UV) | Gain/Loss Factor [dB] | Transducer Factor [dB] | Level | Limit: 1 | 2 | 3 | 4 |
|---|---|---|---|---|---|---|---|---|---|
|  |  |  |  |  |  | dB (uVolts/Meter) | | | |
| 1 | 702.5559 | 30.2 pk | 1.2 | 21.7 | 53.1 | N/A | 55.6 | 57 | N/A |
| 2 | 858.6668 | 22.1 pk | 1.4 | 23.3 | 46.8 | N/A | 55.6 | 57 | N/A | pk = Peak detector
qp = Quasi-Peak detector
av = Average detector
tm = Trace Math Result
LIMIT 1 = NONE
LIMIT 2 = CFR 47 Part 15 Class B1 Meter
LIMIT 3 = CISPR 22 Class B1 Meter
LIMIT 4 = NONE Both modules employed in the tests of FIGS. 5 and 6 were supplied with identical signals, so that the spectral content of the signals from both modules was the same. As can be seen in FIG. 6, the spikes present in FIG. 5 were substantially eliminated from the response curve of FIG. 6. Thus, the noise output escaping the module constructed according to the present invention was indistinguishable from the base line noise of the receiving amplifier. Based on these results, it is clear that optoelectronic modules having a reduced effective aperture as provided by the present invention, provide superior noise immunity over prior art modules.

It should be noted that various changes and modifications to the present invention may be made by those of ordinary skill in the art without departing from the spirit and scope of the present invention which is set out in more particular detail in the appended claims. Furthermore, those of ordinary skill in the art will appreciate that the foregoing description is by way of example only, and is not intended to be limiting of the invention as described in such appended claims.

What is claimed is:

1. An optical subassembly for reducing undesired electromagnetic interference (EMI), comprising:
    an optical package comprising a conductive enclosure having an optically transmissive port, an optoelectronic transmitting element mounted within said optical package;
    a plurality of signal pins, electrically isolated from said conductive enclosure and extending thereftrough to provide electrical signals to said optoelectronic transmitting element;
    a non-electrically conductive housing having an electrically conductive surface configured to receive said optical package, said electrically conductive surface acting to couple an optical signal from said optical package to an optical fiber carried by an optical connector wherein said electrically conductive surface and said optical package are electrically connected and achieve approximately the same ground potential in order to provide a reduced emissions aperture; and
    said non-electrically conductive housing is made of a non-electrically conductive material and the electrically conductive surface of the housing is formed out of a layer of conductive material .

2. The optical subassembly of claim 1 wherein the non-electrically conductive housing is made of non-electrically conductive plastic and the electrically conductive surface of the housing is formed out of a layer of conductive metal.

3. The optical subassembly of claim 1 further comprising a plurality of insulated glass sleeves surrounding said signal pins to provide electrical isolation between a conductive header and said signal pins.

4. The optical subassembly of claim 3 wherein said plurality of signal pins comprises at least one signal ground pin.

5. The optical subassembly of claim 2, wherein the conductive surface of the plastic housing includes a metallic mounting surface attached to said plastic housing, and a metallic alignment ring having said optical package mounted thereon, said alignment ring being affixed to said mounting surface.

6. The optical subassembly of claim 2 wherein said housing includes a passage between said optical package and a fiber optic connector ferrule, exclusive of said passage, said optical subassembly providing a substantially continuous closed conductive surface surrounding said optical package.

7. The optical subassembly of claim 6, wherein said passage defines an emissions aperture through which electromagnetic radiation escapes said housing.

8. The optical subassembly of claim 7 further comprising the passage adjacent a lens and wherein the diameter of the emissions aperture is less than the diameter of the lens.

9. The optical subassembly of claim 7 wherein the diameter of the emissions aperture is less than the diameter of the fiber optic connector ferrule.

10. The optical subassembly of claim 7 wherein the diameter of the emissions aperture is less than 0.020 inches.

11. An optoelectronic transmitter module for transmitting optical data signals from a host device housed within a grounded chassis, said module providing a reduced effective aperture through said chassis, said module comprising:
    electronic circuitry configured to convert digital electrical signals to optical signals;
    a plastic housing having an electrically conductive surface enclosing said electronic circuitry, said plastic housing having a first end adapted to receive a fiber optic connector, said first end further adapted to engage said chassis and be electrically connected thereto to form a conductive barrier at said first end of the plastic housing; and an electrically conductive transmitting optical subassembly disposed within said plastic housing having an electrically conductive surface forming a continuous conductive barrier therewith, said transmitting optical subassembly having first and second ends with a narrow passage therein providing communication between said first end including an optical package and said second end configured to receive a fiber optic connector ferrules.

12. The optoelectronic transmitter module of claim 11 wherein said plastic housing first end and said transmitting optical subassembly are formed with complementary overlapping mating surfaces.

13. The optoelectronic transmitter module of claim 11 further comprising an electromagnetic emissions aperture corresponding to the cross sectional area of said passage between the first and second ends of the transmitting optical subassembly.

14. The optoelectronic transmitter module of claim 11 wherein said optical package further comprises:

an electrically conductive cover having an open base, and a conductive header having an optoelectronic transmitting device mounted thereon, said header being insertable into said base to form a closed conductive surface surrounding said transmitting device, and a plurality of signal pins electrically isolated from said conductive header and extending therethrough to provide electrical signals to said optoelectronic transmitting device.

15. The optoelectronic transmitting module of claim 14 wherein the conductive package comprising the optical package is in electrical contact with the transmitting optical subassembly, such that the host chassis, the module housing, the transmitting optical subassembly and the conductive surface surrounding the optical package are all maintained at the same electrical potential.

16. The optoelectronic transmitting module of claim 15 wherein at least one of said plurality of signal pins extending through said header comprises a signal ground pin connected to a signal ground circuit within said module.

17. The optoelectronic transmitting module of claim 14 further comprising glass sleeves surrounding said signal pins for insulating said pins from said conductive header.

18. The optoelectronic transmitting module of claim 11 wherein said plastic housing first end comprises an SC-Duplex connector receptacle.

19. The optoelectronic transmitting module of claim 11 wherein one row of nine pins protrudes from said module and said pins electrically connect the module to said host device.

20. The optoelectronic transmitting module of claim 11 wherein the module is removably mounted within said host device.

21. An optoelectronic module having a reduced emissions aperture comprising:

a plastic module housing having an electrically conductive surface electrically connected to a case ground potential of a host device and having an end comprising a fiber optic connector receptacle;

a transmitting optical subassembly (TOSA) including an electrically conductive TOSA housing mounted adjacent the receptacle end of the plastic module housing, the plastic module housing and the electrically conductive TOSA housing including overlapping mating surfaces such that said electrically conductive surface of the plastic module housing and said electrically conductive TOSA housing form a continuous conductive barrier across said receptacle end, said electrically conductive TOSA housing defining a bore for receiving a fiber optic connector ferrule, an optics cavity, and a narrow passage between said bore and said cavity;

an optical package mounted within said optics cavity, said optical package including a conductive outer covering engaging the electrically conductive TOSA housing such that said electrically conductive surface of the plastic module housing, said electrically conductive TOSA housing and said optical package outer covering are maintained at the case ground potential of said host device; and a signal ground pin electrically isolated from the optical package outer covering, and extending therethrough to supply a signal ground potential to an optical transmitting device housed within said optical package, said signal ground potential being distinct from said host device case ground potential.

22. The optoelectronic module of claim 21 further comprising an insulating sleeve surrounding said ground pin thereby electrically isolating said pin from the conductive outer covering of the optical package.

23. The optoelectronic module of claim 21 wherein said receptacle end comprises an SC-Duplex fiber optic connector receptacle.

24. The optoelectronic module of claim 23 further comprising a second end opposite said receptacle end, and a single row of nine contact pins extending from said second end, said contact pins being provided to transfer electrical signals between said module and said host device.

25. The optoelectronic module of claim 21 further comprising a ground clip for electrically connecting said plastic module housing to said case ground potential.

26. An optoelectronic module for transmitting optical signals over an optical fiber, the module comprising a plastic housing with an electrically conductive surface having an end configured to receive a fiber optic connector, said end including an electrically conductive optical assembly having a narrow passage therethrough, said optical assembly being placed in overlapping intimate contact with the electrically conductive surface of the plastic housing to form a nearly continuous conductive barrier across the end of the module but for the narrow passage extending through the optical assembly.

27. The optoelectronic module of claim 26 further comprising an output optical signal having a frequency in the range between 30 and 1,000 MHz, and wherein non-output signal electromagnetic emissions from said module are less than 45 db $\mu v/m$ at a distance of one meter from the module.

28. The optoelectronic module of claim 1, where the plastic housing is formed out of non-conductive material and includes an electrically conductive coating on the outer surface of the plastic housing.

29. The optoelectronic module of claim 28, wherein the conductive coating is a metal.

30. The optoelectronic module of claim 29, wherein the conductive coating is approximately 3000 angstroms of stainless steel over 1000 angstroms of copper.

31. The optoelectronic module of claim 29, wherein the conductive coating is deposited in a vacuum chamber via physical vapor deposition.

32. The optoelectronic module of claim 28, wherein the plastic housing is plated with a metallic solution.

33. The optoelectronic module of claim 29, wherein the metallic coating is applied by a flame spraying process.

34. The optical subassembly of claim 1, wherein the non-electrically conductive housing is made of a nonelectrically conductive polymer.

* * * * *